(12) United States Patent
Kim

(10) Patent No.: US 9,548,430 B2
(45) Date of Patent: Jan. 17, 2017

(54) METHOD OF MANUFACTURING LIGHT EMITTING DIODE PACKAGE

(71) Applicant: SAMSUNG ELECTRONICS CO., LTD., Suwon-si, Gyeonggi-do (KR)

(72) Inventor: Jung Hoon Kim, Hwaseong-si (KR)

(73) Assignee: SAMSUNG ELECTRONICS CO., LTD., Samsung-ro,Yeongtong-gu, Suwon-si, Gyeonggi-do (KR)

(*) Notice: Subject to any disclaimer, the term of this patent is extended or adjusted under 35 U.S.C. 154(b) by 0 days.

(21) Appl. No.: 14/797,036

(22) Filed: Jul. 10, 2015

(65) Prior Publication Data

US 2016/0118552 A1   Apr. 28, 2016

(30) Foreign Application Priority Data

Oct. 23, 2014   (KR) .................. 10-2014-0144569

(51) Int. Cl.
| | |
|---|---|
| *H01L 21/00* | (2006.01) |
| *H01L 33/54* | (2010.01) |
| *H01L 33/60* | (2010.01) |
| *H01L 33/50* | (2010.01) |
| *H01L 33/56* | (2010.01) |
| *H01L 23/00* | (2006.01) |

(52) U.S. Cl.
CPC ............ *H01L 33/54* (2013.01); *H01L 24/97* (2013.01); *H01L 33/502* (2013.01); *H01L 33/505* (2013.01); *H01L 33/507* (2013.01); *H01L 33/56* (2013.01); *H01L 33/60* (2013.01); *H01L 2224/16225* (2013.01); *H01L 2224/73253* (2013.01); *H01L 2924/181* (2013.01); *H01L 2933/005* (2013.01); *H01L 2933/0041* (2013.01); *H01L 2933/0058* (2013.01)

(58) Field of Classification Search
CPC .......................... H01L 27/156; H01L 33/505
USPC ...................................................... 438/7, 28
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |

(Continued)

FOREIGN PATENT DOCUMENTS

| | | |
|---|---|---|
| JP | 3546650 B2 | 7/2004 |
| JP | 2010-272653 A | 12/2010 |

(Continued)

*Primary Examiner* — Chandra Chaudhari
(74) *Attorney, Agent, or Firm* — Muir Patent Law, PLLC

(57) ABSTRACT

A method of manufacturing a light emitting diode package comprises steps of: scanning a light emitting diode chip mounted on a package substrate to acquire mounting image data; generating three dimensional (3D) image data by comparing the mounting image data with mounting reference data; and forming an optical structure including a plurality of layers on the package substrate on using the 3D image data.

20 Claims, 15 Drawing Sheets

(56) References Cited

U.S. PATENT DOCUMENTS

| | | | |
|---|---|---|---|
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,093,079 B2 | 1/2012 | Kim |
| 8,129,711 B2 | 3/2012 | Kang et al. |
| 8,179,938 B2 | 5/2012 | Kim |
| 8,263,987 B2 | 9/2012 | Choi et al. |
| 8,288,936 B2 * | 10/2012 | Ohta | H01L 33/50 313/503 |
| 8,324,646 B2 | 12/2012 | Lee et al. |
| 8,329,485 B2 | 12/2012 | McKean |
| 8,399,944 B2 | 3/2013 | Kwak et al. |
| 8,419,497 B2 | 4/2013 | Takasu et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 2007/0155033 A1 | 7/2007 | Kim et al. |
| 2012/0249779 A1 * | 10/2012 | Ji | G01N 21/8806 348/131 |
| 2012/0261848 A1 | 10/2012 | Haraszati |
| 2014/0117473 A1 | 5/2014 | Kierse et al. |

FOREIGN PATENT DOCUMENTS

| | | |
|---|---|---|
| JP | 2012-227413 A | 11/2012 |
| JP | 5508749 B2 | 6/2014 |
| KR | 10-0995983 B1 | 11/2010 |
| KR | 10-1172859 B1 | 8/2012 |

\* cited by examiner

METHOD OF MANUFACTURING LIGHT EMITTING DIODE PACKAGE

CROSS-REFERENCE TO RELATED APPLICATION

This application claims priority to Korean Patent Application No. 10-2014-0144569 filed on Oct. 23, 2014, with the Korean Intellectual Property Office, the entirety of which is incorporated herein by reference.

TECHNICAL FIELD

The present inventive concept relates to a method of manufacturing a light emitting diode package.

BACKGROUND

Light emitting diodes (LEDs), devices containing light emitting materials therein to emit light, may convert energy generated due to the recombination of electrons and electron holes into light to be emitted therefrom. Such LEDs are currently in widespread use in lighting elements, display devices, and light sources, and the development thereof has accordingly been accelerated.

In particular, in accordance with the commercialization of devices such as cellular phone keypads, turn signal lamps, camera flashes, and the like, using gallium nitride (GaN)-based LEDs, the development and usage of which have matured, general lighting devices using a light emitting diode have recently been actively developed. As in products to which a light emitting diode is applied, such as large scale TV backlight units, vehicle headlamps, general lighting devices, and the like, the use thereof has progressed to large-scale products having high outputs and high efficiency and has been gradually broadened.

Accordingly, a method for reducing manufacturing costs in order to implement the mass production of light emitting diode packages have been demanded.

SUMMARY

An exemplary embodiment of the present inventive concept may provide a manufacturing method for reducing manufacturing costs of a light emitting diode package.

According to an exemplary embodiment of the present inventive concept, a method of manufacturing a light emitting diode package may include: scanning a light emitting diode chip mounted on a package substrate to acquire mounting image data; generating three dimensional (3D) image data by comparing the mounting image data with mounting reference data; and forming an optical structure including a plurality of layers on the package substrate using the 3D image data.

The forming of the optical structure on the package substrate may include: forming the optical structure by sequentially stacking the plurality of layers on the package substrate in a direction perpendicular to the package substrate using the 3D image data.

The generating of the 3D image data may include: determining at least one of a shape and a material of the optical structure.

The optical structure may include: at least one of a wavelength conversion layer disposed on an upper surface of the light emitting diode chip and having a substantially constant thickness; a reflector disposed to surround the light emitting diode chip and the wavelength conversion layer; and an encapsulation body sealing the wavelength conversion layer.

A surface of the encapsulation body may be provided with a stepped, uneven structure.

In the step of determining at least one of the shape and the material forming the optical structure, a thickness of the wavelength conversion layer and a surface structure of the encapsulation body may be determined.

The plurality of layers may be formed by disposing a plurality of filaments in parallel with each other.

In each of the plurality of layers, a single filament may be disposed in a thickness direction.

The plurality of layers may be formed to have substantially identical thicknesses.

Layers disposed on the same plane among the plurality of layers may be formed continuously.

The method may further include: prior to the acquiring of the mounting image date, separating the package substrate into portions corresponding to individual light emitting diode packages.

The filaments may include at least one of a polylactic acid (PLA) resin, an acrylonitrile butadiene styrene (ABS) resin, a nylon resin, a polyimide resin, a polyvinyl alcohol, a polycarbonate resin, a polyethylene resin, a polyvinyl chloride resin, a polypropylene resin, a silicone resin and an epoxy resin.

The filaments may include phosphor particles.

The phosphor particles may include at least one of a garnet-based phosphor, a silicate-based phosphor, a nitride-based phosphor, a sulfide-based phosphor, and an oxide-based phosphor.

The forming of the optical structure on the package substrate may include: sampling the 3D image data at a predetermined interval to thereby convert the 3D image data into a plurality of pieces of two-dimensional (2D) image data, and forming the plurality of layers to have sectional shapes corresponding to the respective pieces of 2D image data.

According to another exemplary embodiment of the present inventive concept, a method of manufacturing a light emitting diode package may include: generating first 3D image data by scanning a light emitting diode chip mounted on a package substrate; comparing the first 3D image data with reference 3D image data; calculating a correction value based on a difference between the first 3D image data and the reference 3D image data; generating second 3D image data of an optical structure using the correction value; and forming the optical structure by sequentially stacking a plurality of layers on the package substrate on the basis of the second 3D image data.

Each of the layers is formed by continuous 3D printing.

BRIEF DESCRIPTION OF THE DRAWINGS

The above and other aspects, features and other advantages of the present inventive concept will be more clearly understood from the following detailed description taken in conjunction with the accompanying drawings, in which.

DETAILED DESCRIPTION

Figure 1A:
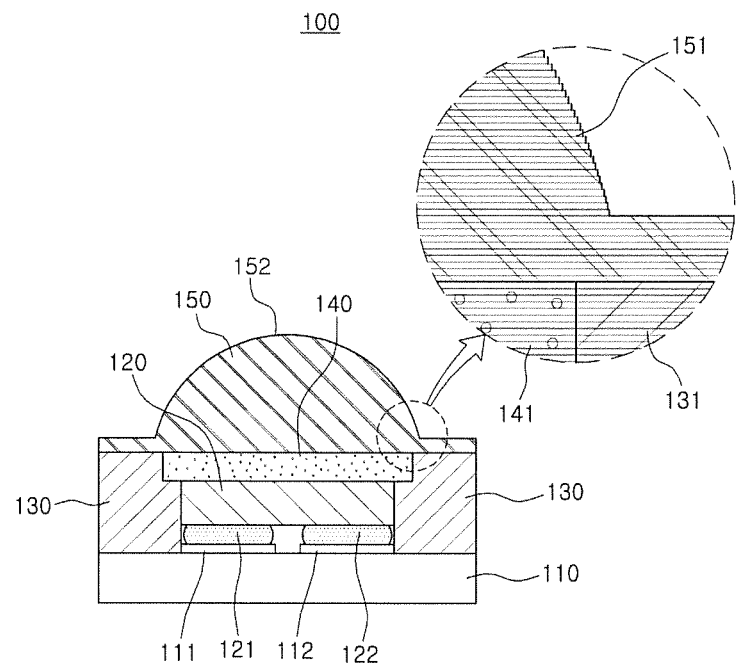
FIG. 1A is a side cross-sectional view of a light emitting diode package according to an exemplary embodiment of the present inventive concept.

Exemplary embodiments of the present inventive concept will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

In the specification, the terms 'above', 'upper portion', 'upper surface', 'below', 'lower portion', 'lower surface', and the like, are used based on the drawings, and may actually be different depending on a direction in which a component is disposed.

Figure 1B:
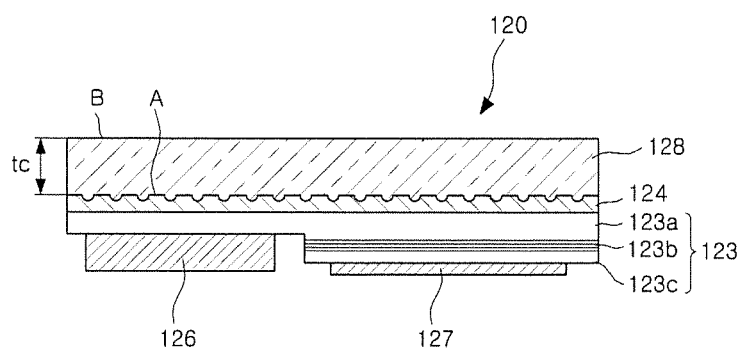
FIG. 1B is an enlarged view of a light emitting diode chip of FIG. 1A.

FIG. 1A is a side cross-sectional view of a light emitting diode package according to an exemplary embodiment of the present inventive concept. FIG. 1B is an enlarged view of a light emitting diode chip of FIG. 1A.

Referring to FIGS. 1A and 1B, a light emitting diode package 100 according to an exemplary embodiment of the present inventive concept may include a package substrate 110 including first and second electrode structures 111 and 112, a light emitting diode chip 120 mounted on the package substrate 110, and an optical structure formed on the light emitting diode chip 120. The optical structure is provided to adjust characteristics of light emitted from the light emitting diode chip 120, and may include a wavelength conversion layer 140 disposed on an upper surface of the light emitting diode chip 120, a reflector 130 covering side surfaces of the light emitting diode chip 120, and an encapsulation body 150 covering upper surfaces of the wavelength conversion layer 140 and the reflector 130.

The first and second electrode structures 111 and 112 may be formed on the package substrate 110, the light emitting diode chip 120 may be mounted on the first and second electrode structures 111 and 112, and first and second electrodes 126 and 127 of the light emitting diode chip 120 may be electrically connected to the first and second electrode structures 111 and 112, using a conductive adhesive layer such as a solder bump.

Here, the package substrate 110 may be formed of an organic resin material containing epoxy, triazine, silicone, polyimide, or the like and other organic resin materials, but in order to improve heat radiation characteristics and light emission efficiency, the package substrate 110 may be formed of a ceramic material having characteristics such as high degrees of heat resistance, thermal conductivity, reflection efficiency, and the like, for example, a material such as $Al_2O_3$, AlN, or the like. However, the material of the package substrate 110 is not limited thereto, and in consideration of heat radiation characteristics and electrical connection relationships of the light emitting diode package 100, the package substrate 110 may be formed of various materials.

In addition to the ceramic substrate described above, a printed circuit board, a lead frame or the like may be used as the package substrate 110 according to the exemplary embodiment.

Referring to FIG. 1B, the light emitting diode chip 120 may include a light transmissive substrate 128 having a first surface A and a second surface B opposed to the first surface A; a light emitting structure 123 disposed on the first surface A of the light transmissive substrate 128; and the first and second electrodes 126 and 127 respectively connected to the light emitting structure 123.

The light transmissive substrate 128 may be provided as a semiconductor growth substrate formed of a material such as sapphire, SiC, $MgAl_2O_4$, MgO, $LiAlO_2$, $LiGaO_2$, GaN, or the like. In this case, sapphire may be a crystal having Hexa-Rhombo R3c symmetry. The sapphire may have a lattice constant of 13.001 Å in a c-axis direction and a lattice constant of 4.758 Å in an a-axis direction and may include a C (0001) plane, an A (11-20) plane, an R (1-102) plane, and the like. In this case, the C plane is mainly used as a nitride growth substrate because the C plane relatively facilitates the growth of a nitride film and is stable at high temperature.

The light transmissive substrate 128 may have the first and second surfaces A and B opposed to each other, and at least one of the first and second surfaces A and B may be provided with an uneven structure. The uneven structure may be provided by etching a portion of the light transmissive substrate 128. Alternatively, the uneven structure may be provided by forming a hetero-material different from that of the light transmissive substrate 128.

As illustrated in FIG. 1B, when the uneven structure is formed on the first surface provided as a growth surface of the light emitting structure 123, stress due to a difference in crystal constants between the light transmissive substrate 128 and a first conductivity type semiconductor layer 123a may be alleviated. Specifically, when a group III nitride semiconductor layer is grown on a sapphire substrate, dislocation defects may occur due to a difference in lattice constants between the substrate and a group III nitride compound semiconductor layer, and the dislocation defects may be upwardly propagated to deteriorate a crystal quality of the semiconductor layer.

In the exemplary embodiment, the uneven structure having prominences may be formed on the light transmissive substrate 128, the first conductivity type semiconductor layer 123a may be grown on side surfaces of the prominences to prevent the dislocation defects from being upwardly propagated. Therefore, a high-quality light emitting diode package may be provided, such that internal quantum efficiency may be advantageously increased.

In addition, since a path of light emitted from an active layer 123b may be variously provided due to the uneven structure, a ratio of light absorbed in the semiconductor layer may be decreased while a light scattering ratio may be increased, such that light extraction efficiency may be increased.

Here, the light transmissive substrate 128 may have a thickness tc of 100 μm or less, preferably, 1 to 20 μm, but the thickness thereof is not limited thereto. The range of the thickness as above described may be obtained by polishing a growth substrate provided for semiconductor growth. Specifically, a method of grinding the second surface B disposed to be opposed to the first surface A on which the light emitting structure 123 is formed, or performing lapping using a lap and a lapping agent so as to polish the second surface B through abrasion and grinding operations, or the like, may be used.

The light emitting structure 123 may include the first conductivity type semiconductor layer 123a, the active layer 123b, and a second conductivity type semiconductor layer 123c, sequentially disposed on the first surface A of the light transmissive substrate 128. The first and second conductivity type semiconductor layers 123a and 123c may be n-type and p-type semiconductor layers, respectively. The first and second conductivity type semiconductor layers 123a and 123c may be formed of a nitride semiconductor. Thus, it may be understood that the first and second conductivity type semiconductor layers 123a and 123c may refer to n-type and p-type semiconductor layers, respectively, in the embodiment, but are not limited thereto. The first and second conductivity type semiconductor layers 123a and 123c may be formed of a material having a compositional formula of $Al_xIn_yGa_{(1-x-y)}N$ ($0 \le x<1$, $0 \le y<1$, $0 \le x+y<1$). For example, a material such as GaN, AlGaN, InGaN, or the like may be used.

The active layer 123b may be a layer emitting visible light having a wavelength range of about 350 nm to 680 nm, and may be configured as an undoped nitride semiconductor layer having a single-quantum well (SQW) or multi-quantum well (MQW) structure. The active layer 123b may be formed to have a multi-quantum well (MQW) structure in which quantum well and quantum barrier layers having a composition of $Al_xIn_yGa_{(1-x-y)}N$ ($0 \le x<1$, $0 \le y<1$, $0 \le x+y<1$) are alternately stacked, and have a predetermined band gap. Due to the quantum well structure, electrons and holes are recombined to emit light. In the case of the multi-quantum well (MQW) structure, an InGaN/GaN structure may be used. The first and second conductivity type semiconductor layers 123a and 123c and the active layer 123b may be formed by a crystal growth process, commonly known in the art, such as Metal Organic Chemical Vapor Deposition (MOCVD), Molecular Beam Epitaxy (MBE), Hydride Vapor Phase Epitaxy (HVPE), or the like.

A buffer layer 124 may be interposed between the light transmissive substrate 128 and the light emitting structure 123. When the light emitting structure 123 is grown on the light transmissive substrate 128, for example, a GAN film provided as the light emitting structure is grown on a heterogeneous substrate, lattice defects such as dislocations may be generated due to a mismatch in lattice constants between the substrate and the GAN film, and the substrate may be warped due to a difference in the coefficient of thermal expansion to cause cracks in the light emitting structure. In order to control the defects and the warpage, the buffer layer 124 may be formed on the substrate 128 and then, the light emitting structure having a desired construction, for example, a nitride semiconductor, may be grown on the buffer layer. The buffer layer 124 may be a low temperature buffer layer formed at a temperature lower than a growth temperature of a single crystal forming the light emitting structure 123, but it is not limited thereto.

The buffer layer 124 may be formed of a material having a composition of $Al_xIn_yGa_{(1-x-y)}N$ ($0 \le x \le 1$, $0 \le y \le 1$) and in particular, GaN, AlN, and AlGaN may be used therefor. For example, the buffer layer 124 may be an undoped GaN layer undoped with impurities and having a predetermined thickness.

The buffer layer 124 is not limited thereto, and any material may be used as the buffer layer as long as it may have a structure capable of improving crystallinity of the light emitting structure 123. A material such as $ZrB_2$, $HfB_2$, ZrN, HfN, TiN, ZnO, or the like may also be used. In addition, the buffer layer 124 may be formed by combining a plurality of layers or may be a layer formed by gradually changing a composition thereof.

The first and second electrodes 126 and 127 may be provided to electrically connect the first and second conductivity type semiconductor layers 123a and 123c to the outside, respectively, such that they may contact the first and second conductivity type semiconductor layers 123a and 123c, respectively.

The first and second electrodes 126 and 127 may be formed of a conductive material that exhibits ohmic-characteristics with the first and second conductivity type semiconductor layers 123a and 123c, respectively, and may have a monolayer structure or a multilayer structure. For example, the first and second electrodes 126 and 127 may be formed of at least one of Au, Ag, Cu, Zn, Al, In, Ti, Si, Ge, Sn, Mg, Ta, Cr, W, Ru, Rh, Ir, Ni, Pd, Pt, a transparent conductive oxide (TCO) and the like, using a deposition method, a sputtering method or the like. The first and second electrodes 126 and 127 may be disposed in the same direction on opposite sides of the light transmissive substrate 128 based on the light emitting structure 123, and may be mounted on the first and second electrode structures 111 and 112 in flip chip form. In this case, light emitted from the active layer 123b may be emitted to the outside via the light transmissive substrate 128.

The optical structure provided to adjust characteristics of light emitted from the light emitting diode chip 120, may include the wavelength conversion layer 140 disposed on an upper surface of the light emitting diode chip 120, the reflector 130 covering the side surfaces of the light emitting diode chip 120, and the encapsulation body 150 covering the upper surfaces of the wavelength conversion layer 140 and the reflector 130.

According to the related art, in order to form such an optical structure, it is necessary to manufacture a device for dispensing a material or a mold, and a device for injecting the material into the mold and the like are required. In the case of modifying a shape of the optical structure, a structure of the device needs to be changed with great expense being caused, and a manufacturing process may be complicated. Thus, a manufacturing cost and time required for the manufacturing process are disadvantageously increased.

In order to solve such defects, in an exemplary embodiment of the present inventive concept, the optical structure may be manufactured by three-dimensional printing (3D printing). 3D printing is a manufacturing technique of producing a 3D object by stacking a plurality of material layers. An exemplary embodiment of the present inventive concept exemplifies a case in which filaments formed of a raw material are melted at high temperature and a plurality of layers formed by bonding the melt filament material are stacked on one another to thereby manufacture a 3D object, but is not limited thereto. Various methods such as a method of irradiating ultraviolet light onto a photocurable liquid resin to manufacture a 3D object may be used.

The wavelength conversion layer 140 may be disposed on the upper surface of the light emitting diode chip 120. The wavelength conversion layer 140 may be formed as a sheet having a substantially constant thickness. Specifically, as illustrated in FIG. 1A, the wavelength conversion layer 140 may be configured to have a shape of a sheet formed by stacking a plurality of wavelength conversion layer (wcl) layers 141.

The plurality of wcl layers 141 may be disposed in a direction perpendicular with respect to the package substrate 110. The respective wcl layers 141 may be formed by heating filaments having an elongated shape such as a thread and be disposed in parallel with each other.

The filament may be formed to have a shape such as a thread shape after phosphor particles are mixed in a resin material. For example, the filament may be formed as a composite material in which phosphors are dispersed in a polymer binder containing a resin, a hardener, a hardening catalyst, or the like. The resin may be one of a polylactic acid resin, an acrylonitrile butadiene styrene resin, a nylon resin, a polyimide resin, a polyvinyl alcohol, a polycarbonate resin, a polyethylene resin, a polyvinyl chloride resin, a polypropylene resin, a silicone resin, and an epoxy resin, or mixed resins thereof.

In this case, the plurality of wcl layers 141 forming the wavelength conversion layer 140 may contain different types of resin and may also have different types of phosphors and the like in the respective layers.

For example, a resin material forming an upper layer may have strength characteristics higher than those of a resin material forming a lower layer, such that the wavelength conversion layer 140 may stably maintain a shape thereof. In addition, the resin material forming the lower layer coming into contact with the light emitting diode chip 120 may be formed to have a degree of adhesion higher than that of the resin material forming the upper layer, thereby facilitating the adhesion thereof with respect to the light emitting diode chip 120. In addition, one of the plurality of layers may be formed as a transparent layer not containing phosphors. In addition, filaments forming the plurality of wcl layers 141 may be disposed to intersect each other in a stacking direction thereof.

Examples of the phosphors may include garnet-based phosphors (YAG, TAG, and LuAG), silicate-based phosphors, nitride-based phosphors, sulfide-based phosphors, oxide-based phosphors and the like, and the phosphors may be configured of single species or a plurality of species mixed in a predetermined ratio.

The reflector 130 provided to reflect light emitted from the light emitting diode chip 120 in a direction upwardly from the light emitting diode package 100, may be formed by stacking a plurality of reflector layers 131 in a similar manner to the case of the wavelength conversion layer 140.

In a similar manner, the plurality of reflector layers 131 may be disposed in a direction perpendicular with respect to the package substrate 110. The respective reflector layers 131 may be formed by heating filaments having an elongated shape such as a thread and be disposed in parallel with each other.

The filament may be formed to have a shape such as a thread shape after phosphor particles are mixed with a resin material. For example, the filament may be formed as a composite material in which phosphors are dispersed in a polymer binder containing a resin, a hardener, a hardening catalyst or the like. The resin may be one of a polylactic acid resin, an acrylonitrile butadiene styrene resin, a nylon resin, a polyimide resin, a polyvinyl alcohol, a polycarbonate resin, a polyethylene resin, a polyvinyl chloride resin, a polypropylene resin, a silicone resin, and an epoxy resin, or a mixed resin thereof. In order to improve a degree of light reflectivity of the reflector 130, a material having a high degree of light reflectivity such as $TiO_2$ may be mixed.

The encapsulation body 150 may be disposed to cover the wavelength conversion layer 140. The encapsulation body 150 may seal the wavelength conversion layer 140 to protect the wavelength conversion layer 140 from moisture and heat. In addition, the encapsulation body 150 may include a lens part 152 controlling a distribution of light emitted from the light emitting diode chip 120 by adjusting a shape of a surface thereof. In a similar manner to the case of the wavelength conversion layer 140 as described above, the lens part 152 may be formed by stacking a plurality of encapsulation body layers 151.

In a similar manner, the plurality of encapsulation body layers 151 may be disposed in a direction perpendicular with respect to the package substrate 110. The respective encapsulation body layers 151 may be formed by heating filaments having an elongated shape such as a thread and be disposed in parallel with each other.

The filament may be formed to have a shape such as a thread shape after phosphor particles are mixed with a resin material. For example, the filament may be formed as a composite material in which phosphors are dispersed in a polymer binder containing a resin, a hardener, a hardening catalyst or the like. The resin may be one of a polylactic acid resin, an acrylonitrile butadiene styrene resin, a nylon resin, a polyimide resin, a polyvinyl alcohol, a polycarbonate resin, a polyethylene resin, a polyvinyl chloride resin, a polypropylene resin, a silicone resin and an epoxy resin, or mixed resins thereof. In this case, the encapsulation body 150 may be preferably formed of a material having excellent light transmissive properties among the said materials, to significantly decrease the absorption of light emitted from the light emitting diode chip 120.

As described above, the surface of the encapsulation body 150 may be formed in various manners in order to control the distribution of light emitted from the light emitting diode chip 120. Specifically, the lens part 152 such as a convex lens or a concave lens may be formed to control the distribution of light. FIG. 1A illustrates a case in which the lens part 152 having a convex lens shape is formed. Since the encapsulation body 150 is configured of a plurality of encapsulation body layers 151, the lens part 152 formed on the surface thereof may be provided with a fine, stepped, uneven structure. Thus, since total reflection from the surface of the encapsulation body 150 may be reduced, external light extraction efficiency of the light emitting diode package 100 may be further improved.

Since the light emitting diode package 100 having such a configuration may be formed by stacking a plurality of layers formed through bonding a filament, a structure thereof may be manufactured without a separate mold. Thus, the small-quantity batch production of the light emitting diode package 100 may be facilitated, and even in the case that due to a problem occurring in a manufacturing process, a configuration of a portion of individual light emitting diode packages 100 needs to be modified, a flexible response to the case may be enabled.

Then, a light emitting diode package 200 according to another exemplary embodiment of the present inventive concept will be described.

Figure 2:
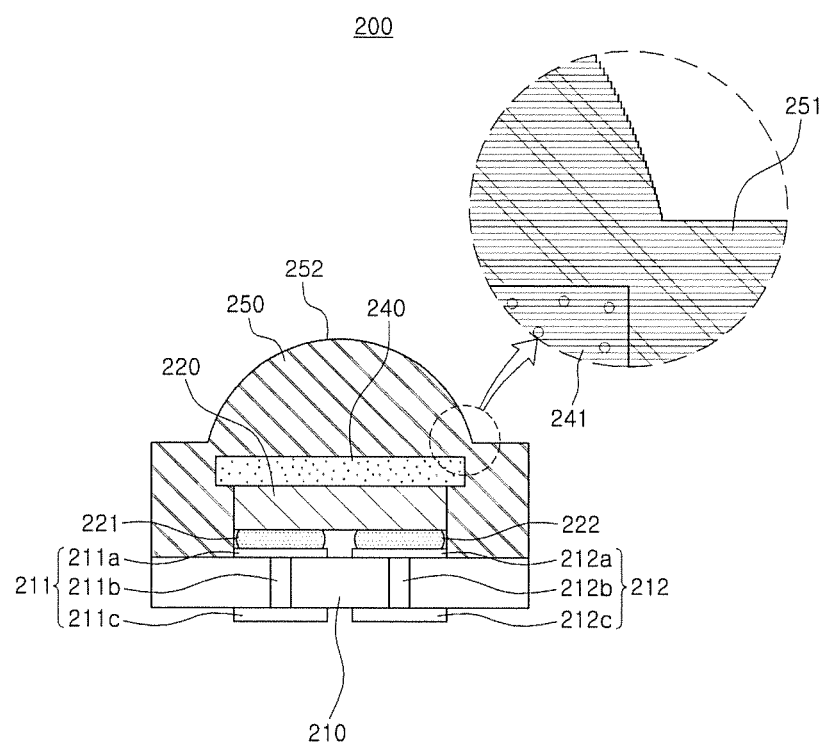
FIG. 2 is a side cross-sectional view of a light emitting diode package according to another exemplary embodiment of the present inventive concept.

FIG. 2 is a side cross-sectional view of the light emitting diode package 200 according to another exemplary embodiment of the present inventive concept. In comparison with an exemplary embodiment described as above, the exemplary embodiment is different from the foregoing embodiment in that the light emitting diode package 200 is a wafer level package (WLP), a constitution for completing the package in a wafer state. Since other configurations of the exemplary embodiment are identical to those of the foregoing exemplary embodiment, different configurations thereof will mainly be explained.

As illustrated in FIG. 2, the light emitting diode package 200 according to another exemplary embodiment of the present inventive concept may include a package substrate 210 including first and second electrode structures 211 and 212, a light emitting diode chip 220 mounted on the package substrate 210, and an optical structure formed on the light emitting diode chip 220.

Specifically, in the package substrate 210, first and second via electrodes 211b and 212b penetrating through one surface of the package substrate 210 on which the light emitting diode chip 220 is mounted and the other thereof may be formed in a thickness direction thereof, and first bonding pads 211a and 211c and second bonding pads 212a and 212c may be formed on the one surface and the other surface of the package substrate 210 to which both ends of the first and second via electrodes 211b and 212b are exposed, whereby both surfaces of the package substrate 210 may be electrically connected to each other. The package substrate 210 may be a substrate for manufacturing the wafer level package (WLP), a constitution for completing the package in a wafer state. Both surfaces of the substrate for the wafer level package (WLP) may be respectively configured as flat surfaces, such that a size of the package on which the light emitting diode chip 220 is mounted may be reduced to approximately a size of the light emitting diode chip 220.

The optical structure provided to adjust characteristics of light emitted from the light emitting diode chip 220 may include a wavelength conversion layer 240 disposed on an upper surface of the light emitting diode chip 220 and an encapsulation body 250 covering the wavelength conversion layer 240.

The wavelength conversion layer 240 may be disposed on the upper surface of the light emitting diode chip 220. The wavelength conversion layer 240 may be formed as a sheet having a substantially constant thickness, similarly to an exemplary embodiment. The wavelength conversion layer 240 may be configured to have a shape of a sheet formed by stacking a plurality of wavelength conversion layer (wcl) layers 241. In addition, the plurality of wcl layers 241 may be stacked in a direction perpendicular with respect to the package substrate 210. The respective wcl layers 241 may be formed by heating filaments formed by elongating a raw material forming the wavelength conversion layer 240, such as having a thread shape and may be disposed in parallel with each other.

The encapsulation body 250 may be disposed to cover the wavelength conversion layer 240. The encapsulation body 250 may seal the wavelength conversion layer 240 to protect the wavelength conversion layer 240 from moisture and heat. In addition, the encapsulation body 250 may include a lens part 252 controlling a distribution of light emitted from the light emitting diode chip 220 by adjusting a shape of a surface thereof. In a similar manner to the case of the wavelength conversion layer 240 as described above, the encapsulation body 250 may be formed by stacking a plurality of encapsulation body layers 251.

Next, a method of manufacturing the light emitting diode package according to an exemplary embodiment of the present inventive concept will be explained. FIGS. 3 through 7 are views illustrating a method of manufacturing the light emitting diode package of FIG. 1A. FIG. 1A is a side cross-sectional view of a light emitting diode package according to an exemplary embodiment of the present inventive concept. FIG. 1B is an exploded view of a light emitting diode chip of FIG. 1A.

Figure 3:
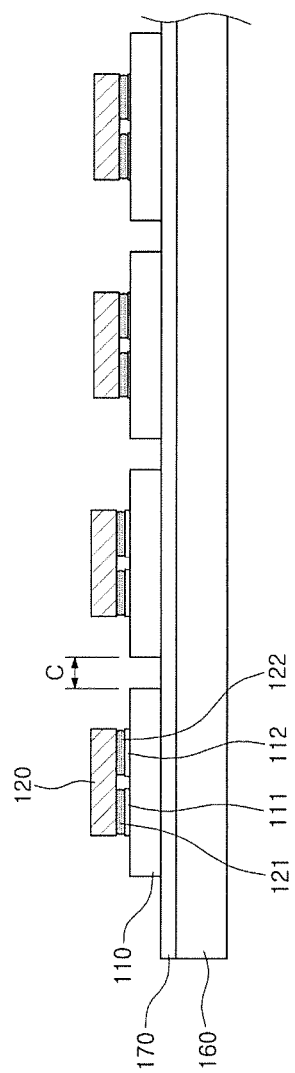
FIGS. 3 through 7 are views illustrating a method of manufacturing the light emitting diode package of FIG. 1A.

First, as illustrated in FIG. 3, the light emitting diode chip 120 may be mounted on the first and second electrode structures 111 and 112 of the package substrate 110. The light emitting diode chip 120 may be a light emitting diode chip having a structure as illustrated in FIG. 1B. The first and second electrodes 126 and 127 of the light emitting diode chip 120 may be electrically connected to the first and second electrode structures 111 and 112 of the package substrate 110 by solder bumps 121 and 122.

The package substrate 110 may be provided in plural, and the package substrate 110 may be cut into portions corresponding to individual light emitting diode packages and be separated from each other before the light emitting diode chip 120 is mounted thereon. In this manner, when the package substrate 110 is pre-cut into individual package substrates, the individual package substrates may be attached onto a base film 170 and the base film may be expanded, such that the respective package substrates 110 may be disposed to be spaced apart from one another by a distance C.

A heating state 160 for heating the package substrates 110 may be disposed on a lower portion of the base film 170 in a subsequent process.

Figure 4:
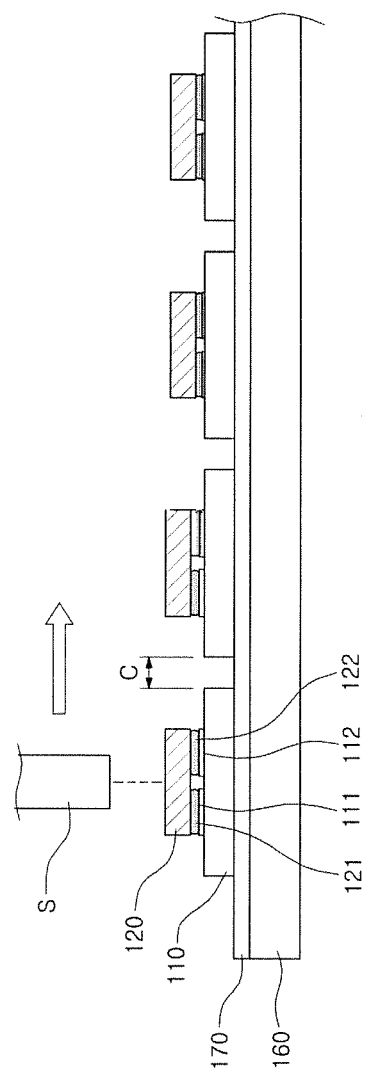

Next, as illustrated in FIG. 4, a state in which the light emitting diode chip 120 is mounted on the package substrate 110 may be indicated as data by performing three-dimensional (3D) scanning on the light emitting diode chip 120 mounted on the package substrate 110, using a scanner S. The data may be extracted by converting a position of the light emitting diode chip 120 into relative coordinates thereof on the package substrate 110.

Since the light emitting diode package 100 generally serves as a point source of light, designed optical characteristics thereof may be exhibited only in the case that the light emitting diode chip 120 is precisely mounted in a target position. However, due to limitations in a manufacturing process, error such as from a manufacturing tolerance may occur in a process of mounting the light emitting diode chip 120 and accordingly, optical characteristics generally have a certain degree of dispersion. In the case that such error is outside of a tolerance limit (hereinafter, referred to as "mounting reference data"), designed specifications may not be satisfied and thus there may be defects.

In order to solve such limitations, in the exemplary embodiment, after the light emitting diode chip 120 is mounted on the package substrate 110, the mounted light emitting diode chip 120 may be scanned to thereby generate "mounting image data" formed by indicating a state in which each light emitting diode chip 120 is actually mounted as data. Thereafter, in a subsequent process, an optical structure formed on a light emitting diode chip outside of the mounting reference data may be formed to have a structure capable of compensating for an error occurring in a process of mounting the light emitting diode chip 120, such that defects in the light emitting diode package 100 may be reduced. With reference to this, an explanation thereof will be made in the succeeding process.

In the case that the light emitting diode chip 120 is provided in plural, a manufacturing time may be preferably reduced by generating the mounting image data of the plurality of light emitting diode chips 120 through a single scanning operation.

Whether or not the mounting image data coincides with the mounting reference data may be determined by comparing the mounting image data generated as above with the mounting reference data. When the mounting image data coincides with the mounting reference data, the light emitting structure may be disposed on the package substrate 110 on the basis of three dimensional (3D) image data of an optical structure modeled based on the mounting reference data. When the mounting image data does not coincide with the mounting reference data, a determination may be made such that the light emitting structure is disposed in such a manner as to decrease such an error, and the consequent 3D image data of the light emitting structure may be generated. For example, such an error may be reduced by changing a shape and a disposition of the optical structure, for example, modifying a shape of the lens part 152 formed on the encapsulation body 150 or changing a thickness of the wavelength conversion layer 140, a composition of phosphors or the like.

Figure 5:
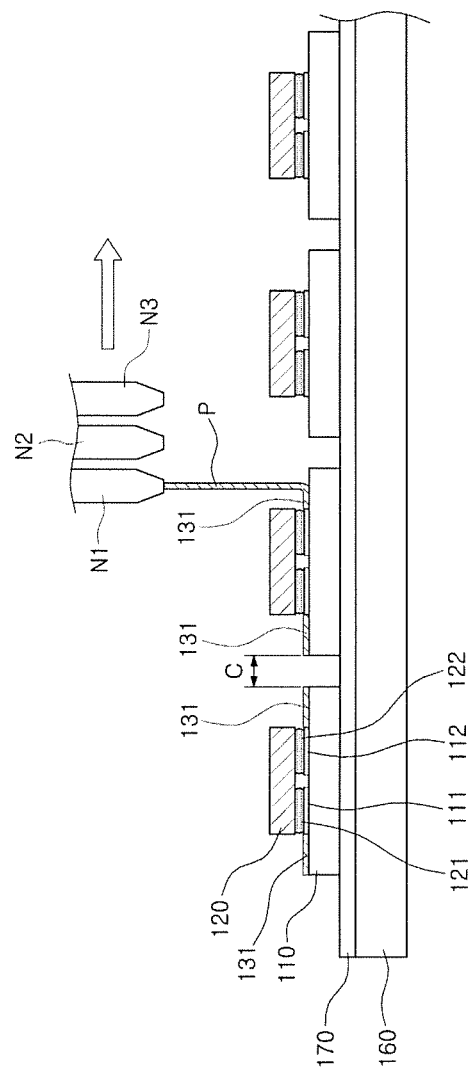
Figure 6:
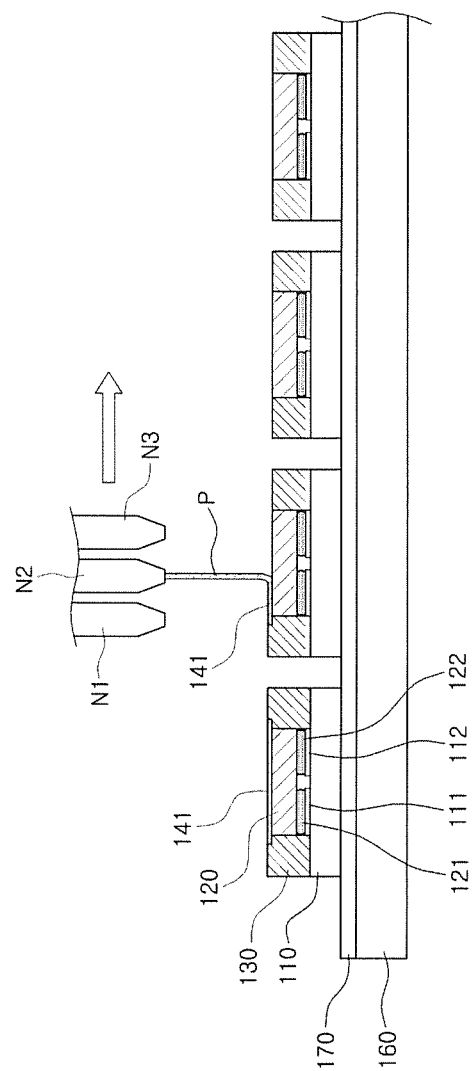
Figure 7:
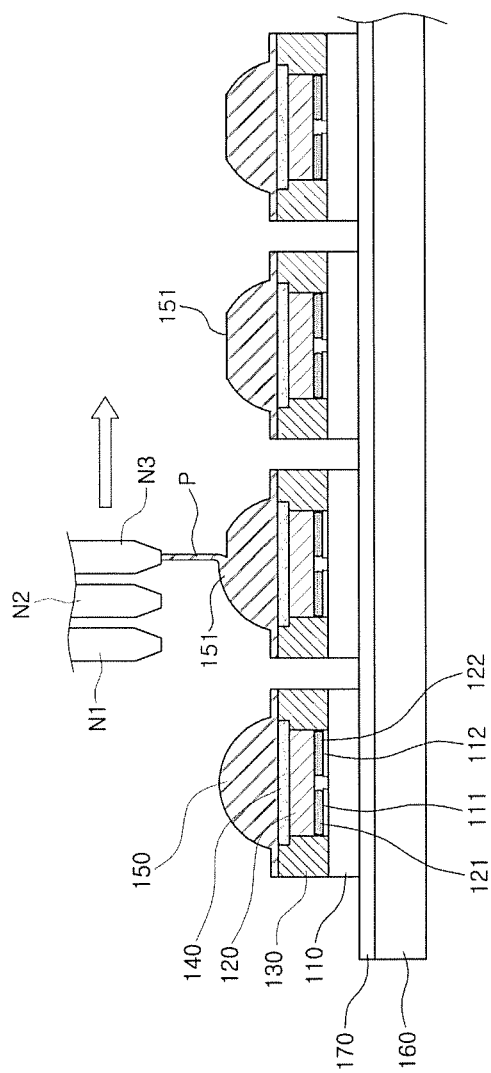

Next, as illustrated in FIGS. 5 through 7, the optical structure may be disposed on the package substrate 110 on the basis of the generated 3D image data.

Specifically, as illustrated in FIG. 5, a filament P may be heated and attached to the package substrate 110 through a nozzle N1, N2, and N3, such that a plurality of layers forming the optical structure may be sequentially stacked. FIG. 5 illustrates a case in which the reflector layers 131 of the reflector are first disposed, but is not limited thereto. The wavelength conversion layer or the encapsulation body may be first disposed.

In the case that a plurality of light emitting diode chips 120 are disposed, arranging the reflector layers 131 to be disposed on the same plane, continuously, may be advantageous for a reduction in manufacturing time. For example, it may be preferable to continuously form the same reflector layers 131 on the circumferences of the plurality of light emitting diode chips 120 while the nozzle N1 moves from the left to the right of FIG. 5.

By repeating such an operation, the reflector 130 formed of the plurality of reflector layers 131 may be formed as illustrated in FIG. 6. Even in the case where arranging the reflector layers 131 to be disposed on the same plane, continuously, may be preferable, the layers of the reflector 130 and the wavelength conversion layer 140 may be disposed continuously. For example, while nozzles N1 and N2 move from the left to the right in the drawing, the reflector layer 131 of the reflector 130 may be formed on an upper portion of the reflector 130 and the wcl layer 141 of the wavelength conversion layer may be formed on an upper portion of the wavelength conversion layer 140.

Next, as illustrated in FIG. 7, the filament P may be heated and attached so as to cover the wavelength conversion layer 140, through a nozzle N3, such that the encapsulation body 150 having a plurality of layers stacked therein may be formed. The consequent package substrate may be cut into individual light emitting diode packages, such that the light emitting diode package 100 illustrated in FIG. 1A may be completed.

Next, a method of manufacturing the light emitting diode package according to another exemplary embodiment of the present inventive concept will be explained. FIG. 2 is a side cross-sectional view of a light emitting diode package according to another exemplary embodiment of the present inventive concept. FIGS. 8 through 10B are views illustrating a method of manufacturing the light emitting diode package of FIG. 2.

In comparison with an exemplary embodiment described as above, the exemplary embodiment is different from the foregoing embodiment in that the light emitting diode package 200 is a wafer level package (WLP), a constitution for completing the package in a wafer state. In addition, unlike the foregoing embodiment in which a separate reflector 130 is disposed on the side surfaces of the light emitting diode chip 120, the exemplary embodiment has differences in terms of an encapsulation body 250 sealing side surfaces of a light emitting diode chip 220. Since other configurations of the exemplary embodiment are identical to those of the foregoing exemplary embodiment, different configurations thereof will be mainly explained.

Figure 8:
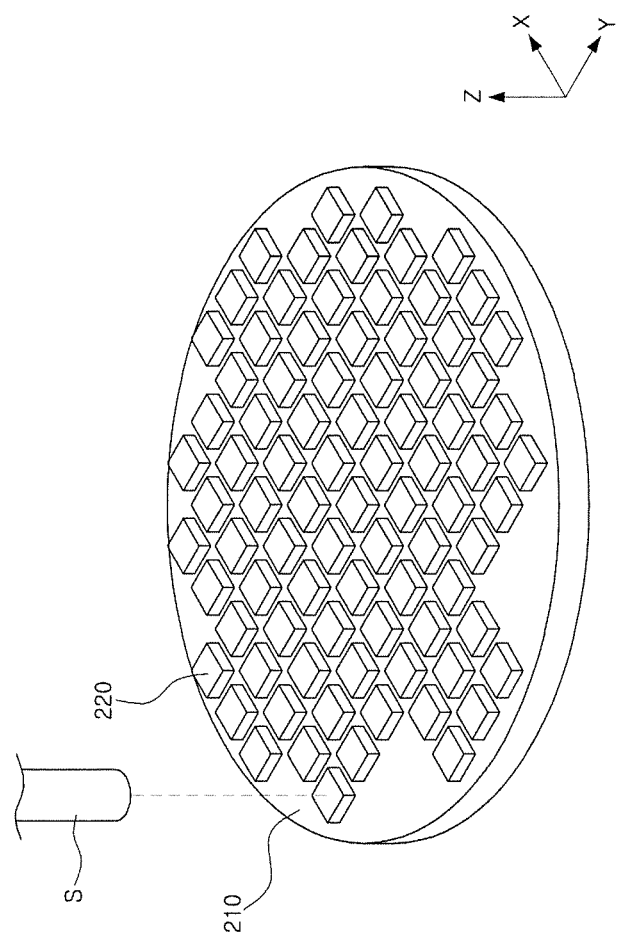
FIGS. 8 through 10B are views illustrating a method of manufacturing the light emitting diode package of FIG. 2.

As illustrated in FIG. 8, after a state in which the light emitting diode chip 220 is mounted on the package substrate 210 may be indicated as data by performing three-dimensional (3D) scanning on the light emitting diode chip 220 mounted on the package substrate 210, using the scanner S, the mounting image data may be generated on the basis of the data. Whether or not the mounting image data coincides with the mounting reference data may be determined by comparing the mounting image data generated as above with the mounting reference data. When the mounting image data coincides with the mounting reference data, the light emitting structure may be disposed on the package substrate 210 on the basis of three dimensional (3D) image data of an optical structure modeled based on the mounting reference data. When the mounting image data does not coincide with the mounting reference data, determination may be made such that the optical structure is disposed in such a manner as to decrease such an error, and the consequent 3D image data of the optical structure may be generated.

Figure 9A:
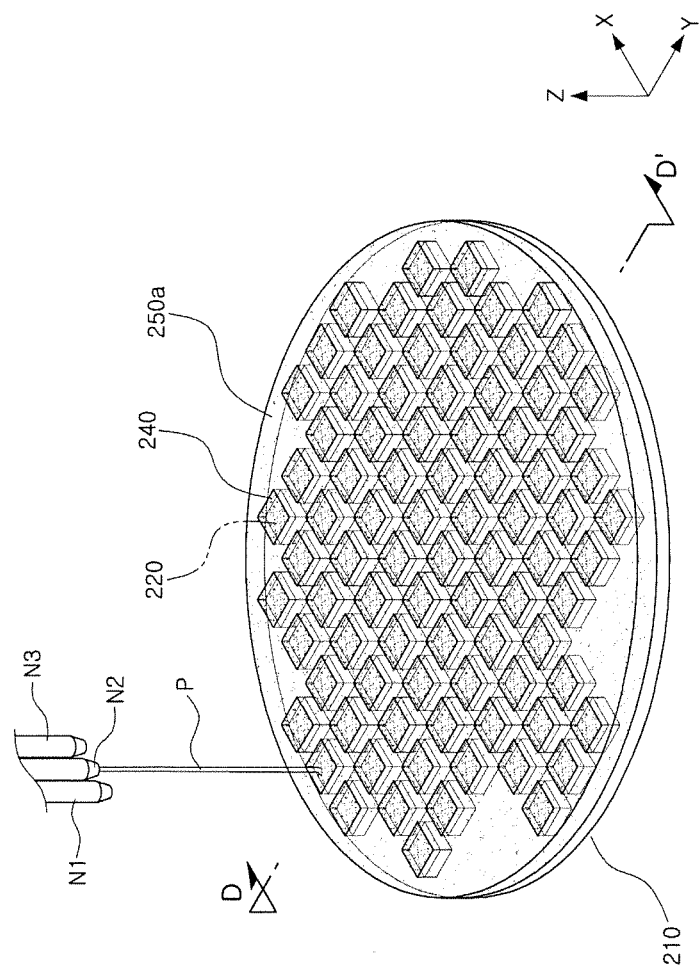
Figure 9B:
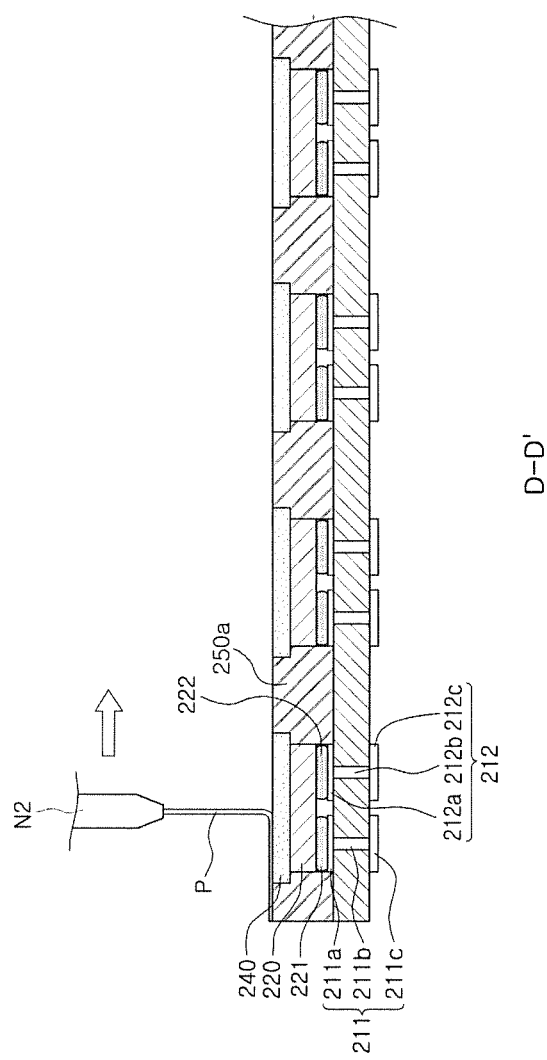

Next, as illustrated in FIGS. 9A and 9B, the optical structure may be disposed on the package substrate 210 on the basis of the generated 3D image data. FIG. 9A illustrates a process of attaching the filament P onto the package substrate 210, and FIG. 9B is a cross-sectional view of the package substrate 210 of FIG. 9A, taken along line D-D'.

Specifically, as illustrated in FIG. 9A, the filament P may be heated and attached to the package substrate 210 through the nozzle N2, such that a plurality of layers forming the encapsulation body 250 may be sequentially stacked. In the case that a plurality of light emitting diode chips 220 are disposed, arranging encapsulation body layers 251 to be disposed on the same plane, continuously, may be advantageous for a reduction in a manufacturing time.

Figure 10A:
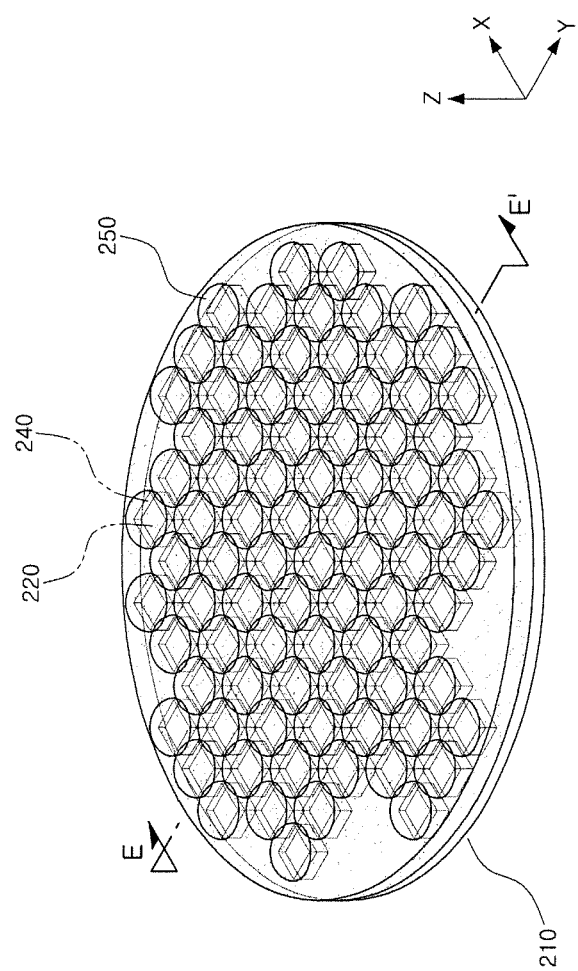
Figure 10B:
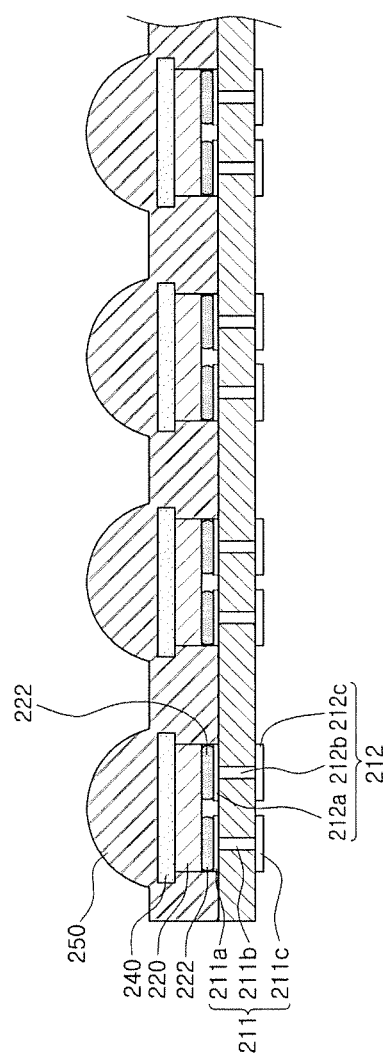

Through the processes as described above, as illustrated in FIGS. 10A and 10B, the encapsulation body 250 having the plurality of layers stacked therein may be formed. FIG. 10A illustrates a state in which the encapsulation body 250 is formed. FIG. 10B is a cross-sectional view of the package substrate 210 of FIG. 10A, taken along line E-E'. When the package substrate 210 is cut into individual light emitting diode packages, the light emitting diode package 200 illustrated in FIG. 2 may be completed.

In the method of manufacturing the light emitting diode packages 100 and 200 configured as above, since the light emitting diode packages 100 and 200 configured as above may be formed by stacking a plurality of layers formed through bonding the filament P, a structure thereof may be manufactured without a separate mold. Thus, the small quantity batch production of the light emitting diode packages 100 and 200 may be facilitated, and even in the case that due to a problem occurring in a manufacturing process, a configuration of a portion of individual light emitting diode packages 100 and 200 needs to be modified, a flexible response to the case may be enabled.

Figure 11:
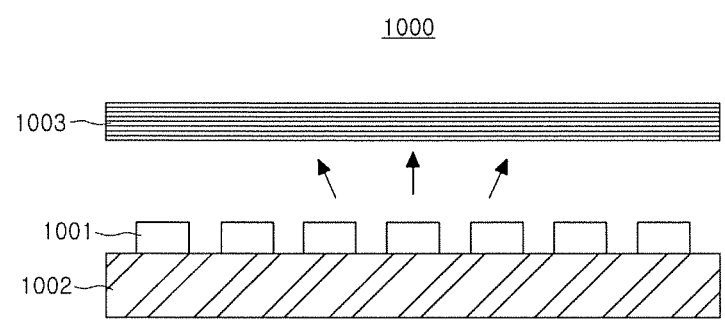
FIGS. 11 and 12 are views respectively illustrating an example of applying the light emitting diode package according to an exemplary embodiment of the present inventive concept to a backlight unit.
Figure 12:
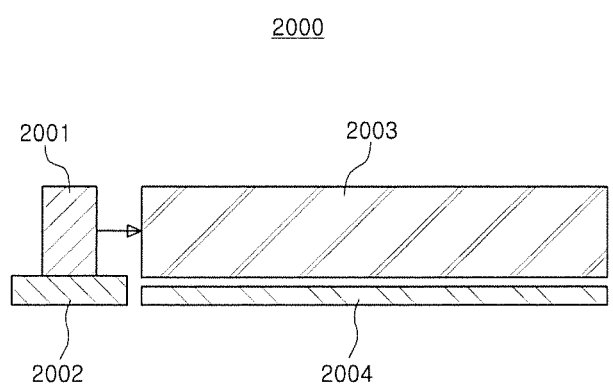

FIGS. 11 and 12 are views respectively illustrating an example of applying the light emitting diode package according to an exemplary embodiment of the present inventive concept to a backlight unit.

Referring to FIG. 11, a backlight unit 1000 may include a light source 1001 mounted on a substrate 1002 and at least one optical sheet 1003 disposed thereabove. The light source 1001 may include the light emitting diode package as described above.

The light source 1001 in the backlight unit 1000 of FIG. 11 emits light toward a liquid crystal display (LCD) device disposed thereabove. On the other hand, a light source 2001 mounted on a substrate 2002 in a backlight unit 2000 according to another embodiment illustrated in FIG. 12 emits light laterally, and the emitted light is incident to a light guide plate 2003 and may be converted into the form of a surface light source. The light having passed through the light guide plate 2003 may be emitted upwardly and a reflective layer 2004 may be formed under a bottom surface of the light guide plate 2003 in order to improve light extraction efficiency.

Figure 13:
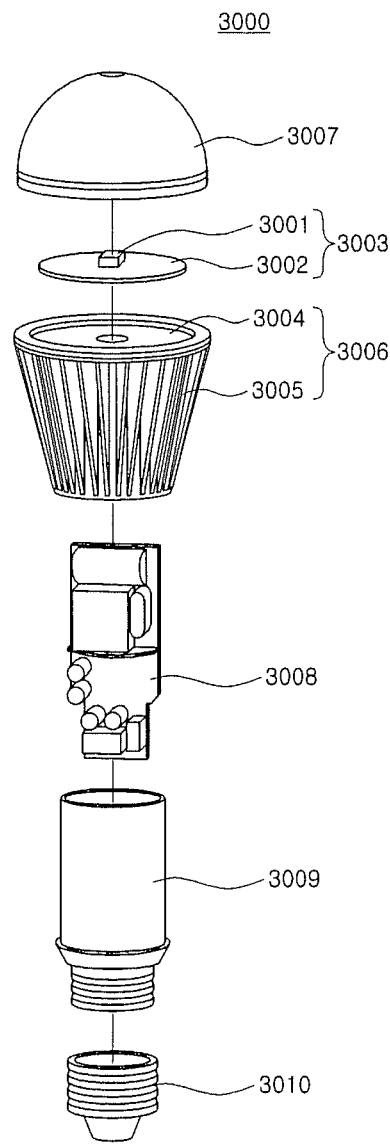
FIG. 13 is a view illustrating an example of applying the light emitting diode package according to an exemplary embodiment of the present inventive concept to a lighting device.

FIG. 13 is an exploded perspective view illustrating an example of a lighting device to which the light emitting diode package according to an exemplary embodiment of the present inventive concept is applied.

Referring to FIG. 13, a lighting device 3000 is exemplified as a bulb-type lamp, and includes a light emitting module 3003, a driving unit 3008 and an external connector unit 3010.

In addition, exterior structures such as an external housing 3006, an internal housing 3009, a cover unit 3007 and the like may be additionally included. The light emitting module 3003 may include the light emitting diode package as described above or a light source 3001 having a structure the same as or similar to that of the light emitting diode package and a circuit board 3002 having the light source 3001 mounted thereon. For example, the first and second electrodes of the light emitting diode package as described above may be electrically connected to electrode patterns of the circuit board 3002. The embodiment illustrates the case in which a single light source 3001 is mounted on the circuit board 3002; however, if necessary, a plurality of light sources may be mounted thereon.

The external housing 3006 may serve as a heat radiating part, and include a heat sink plate 3004 indirect contact with the light emitting module 3003 to improve the dissipation of heat and heat radiating fins 3005 covering a lateral surface of the lighting device 3000. The cover unit 3007 may be disposed above the light emitting module 3003 and may have a convex lens shape. The driving unit 3008 may be disposed inside the internal housing 3009 and may be connected to the external connector unit 3010, such as a socket structure, to receive power from an external power source. In addition, the driving unit 3008 may convert the received power into a current source appropriate for driving the light source 3001 of the light emitting module 3003 and supply the converted current source thereto. For example, the driving unit 3008 may be configured of an AC-DC converter, a rectifying circuit part, or the like.

Figure 14:
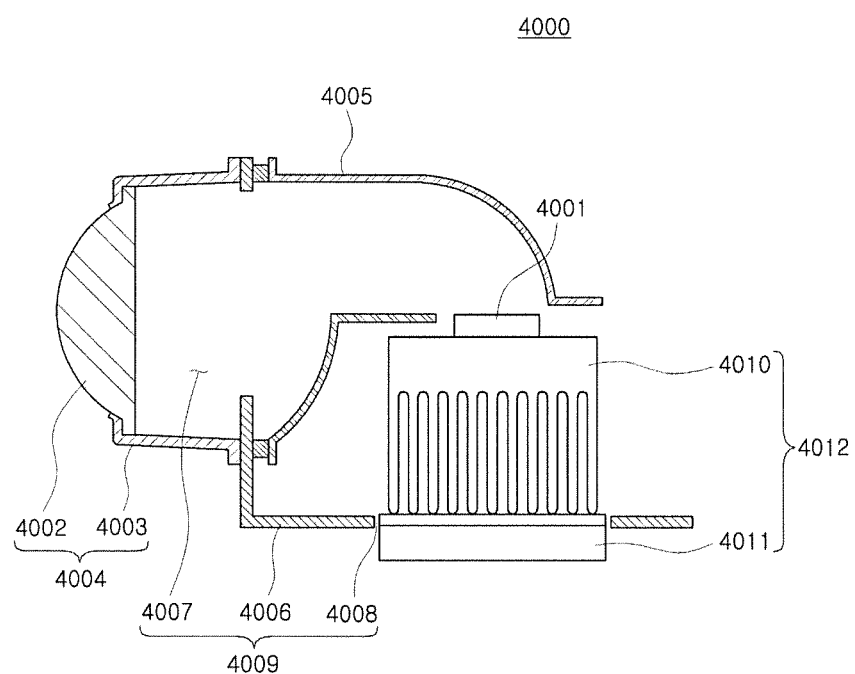
FIG. 14 is a view illustrating an example of applying the light emitting diode package according to an exemplary embodiment of the present inventive concept to a headlamp.

FIG. 14 is a view illustrating an example of applying the light emitting diode package according to an exemplary embodiment of the present inventive concept to a headlamp.

Referring to FIG. 14, a headlamp 4000 used as a vehicle lighting element or the like may include a light source 4001, a reflective unit 4005 and a lens cover unit 4004, the lens cover unit 4004 including a hollow guide part 4003 and a lens 4002. The light source 4001 may include the light emitting diode package as described above.

The headlamp 4000 may further include a heat radiating unit 4012 dissipating heat generated by the light source 4001 outwardly. The heat radiating unit 4012 may include a heat sink 4010 and a cooling fan 4011 in order to effectively dissipate heat. In addition, the headlamp 4000 may further include a housing 4009 allowing the heat radiating unit 4012 and the reflective unit 4005 to be fixed thereto and supported thereby. The housing 4009 may include a body part 4006 and a central hole 4008 to which the heat radiating unit 4012 is coupled, the central hole 4008 being formed in one surface of the housing 4009.

The other surface of the housing 4009 integrally connected to and bent in a direction perpendicular to the one surface of the housing 4009 may be provided with a forward hole 4007 such that the reflective unit 4005 may be disposed above the light source 4001. Accordingly, a forward side may be opened by the reflective unit 4005 and the reflective unit 4005 may be fixed to the housing 4009 such that the opened forward side corresponds to the forward hole 4007, whereby light reflected by the reflective unit 4005 may pass through the forward hole 4007 to thereby be emitted outwardly.

As set forth above, according to exemplary embodiments of the present inventive concept, since a light emitting diode package is manufactured by 3D scanning a mounted light emitting diode chip and performing 3D printing on the basis of a scanned result, a manufacturing cost of the light emitting diode package may be reduced.

While exemplary embodiments have been shown and described above, it will be apparent to those skilled in the art that modifications and variations could be made without departing from the spirit and scope of the present inventive concept as defined by the appended claims.

What is claimed is:

1. A method of manufacturing a light emitting diode package, the method comprising steps of:
   mounting a light emitting diode chip on a package substrate;
   scanning the light emitting diode chip mounted on the package substrate to acquire mounting image data;
   generating three dimensional (3D) data by comparing the mounting image data with mounting reference data; and
   forming an optical structure including a plurality of layers on the package substrate using the 3D data,
   wherein the optical structure is formed to compensate a difference between the mounting image data and the mounting reference data when the mounting image data does not coincide with the mounting reference data.

2. The method of claim 1, wherein the step of forming the optical structure includes a step of forming the optical structure by sequentially stacking the plurality of layers on the package substrate in a direction perpendicular to the package substrate using the 3D data.

3. The method of claim 1, wherein the step of generating the 3D data includes a step of determining at least one of a shape and a material of the optical structure.

4. The method of claim 3, wherein the optical structure includes at least one of a wavelength conversion layer disposed on an upper surface of the light emitting diode chip and having a substantially constant thickness; a reflector disposed to surround the light emitting diode chip and the wavelength conversion layer; and an encapsulation body sealing the wavelength conversion layer.

5. The method of claim 4, wherein the step of determining at least one of the shape and the material of the optical structure includes a step of determining a thickness of the wavelength conversion layer and a surface structure of the encapsulation body.

6. The method of claim 5, wherein a surface of the encapsulation body is provided with a stepped, uneven structure.

7. The method of claim 2, wherein the plurality of layers are formed from a plurality of filaments.

8. The method of claim 7, wherein the plurality of layers are disposed in parallel.

9. The method of claim 7, wherein in each of the plurality of layers comprises a single filament disposed in a thickness direction.

10. The method of claim 2, wherein the plurality of layers have substantially identical thicknesses.

11. The method of claim 2, wherein a layer disposed on a plane is formed continuously.

12. The method of claim 1, further comprising the step of separating the package substrate into portions corresponding to the individual light emitting diode packages before the step of acquiring the mounting image data.

13. The method of claim 7, wherein the filaments comprise at least one of a polylactic acid (PLA) resin, an acrylonitrile butadiene styrene (ABS) resin, a nylon resin, a polyimide resin, a polyvinyl alcohol, a polycarbonate resin, a polyethylene resin, a polyvinyl chloride resin, a polypropylene resin, a silicone resin, and an epoxy resin.

14. The method of claim 13, wherein the filaments further comprise phosphor particles.

15. The method of claim 14, wherein the phosphor particles comprise at least one of a garnet-based phosphor, a silicate-based phosphor, a nitride-based phosphor, a sulfide-based phosphor, and an oxide-based phosphor.

16. The method of claim 1, wherein the step of forming the optical structure includes: sampling the 3D data at a predetermined interval to convert the 3D data into a plurality of pieces of two-dimensional (2D) image data, and forming the plurality of layers to have sectional shapes corresponding to the respective pieces of 2D image data.

17. A method of manufacturing a light emitting diode package, the method comprising steps of:
    generating first 3D data by scanning a light emitting diode chip mounted on a package substrate;
    comparing the first 3D data with reference 3D data;
    calculating a correction value using a difference between the first 3D data and the reference 3D data;
    generating second 3D data of an optical structure using the correction value; and
    forming the optical structure by sequentially stacking a plurality of layers on the package substrate according to the second 3D data.

18. The method of claim 17, wherein each of the layers is formed by 3D printing.

19. The method of claim 18, wherein the layers are formed continuously.

20. A method of manufacturing a light emitting diode package, the method comprising steps of:
    mounting a light emitting diode chip on a package substrate;
    scanning the light emitting diode chip mounted on the package substrate to acquire mounting image data;
    generating three dimensional (3D) data by comparing the mounting image data with mounting reference data; and
    forming an optical structure including a plurality of layers on the package substrate using the 3D data,
    wherein the optical structure is formed with a predetermined structure when the mounting image data coincides with the mounting reference data.

* * * * *